United States Patent [19]

Strain et al.

[11] 3,925,806

[45] Dec. 9, 1975

[54] TRANSFER FILTER FOR TRANSFER DEVICES

[75] Inventors: Robert Joseph Strain, North Indialantic, Fla.; Karvel Kuhn Thornber, Berkeley Heights, N.J.

[73] Assignee: Bell Telephone Laboratories, Incorporated, Murray Hill, N.J.

[22] Filed: Nov. 29, 1974

[21] Appl. No.: 528,030

Related U.S. Application Data

[63] Continuation-in-part of Ser. No. 373,269, June 25, 1973, abandoned.

[52] U.S. Cl. ............... 357/24; 307/304; 307/221 D

[51] Int. Cl.$^2$ ........................................ H01L 29/78

[58] Field of Search ..... 357/24, 41; 307/304, 221 D

[56] References Cited

OTHER PUBLICATIONS

Thornber, K., *I.E.E.E. Transactions on Electron Devices*, Vol. ED–18, No. 10, Oct. 1971, pp. 941–950.

Chai et al., *I.B.M. Tech. Discl. Bull.*, Vol. 16, No. 4, Sept. 1973, pp. 1099–1100.

Heller et al., *I.B.M. Tech. Discl. Bull.*, Vol. 16, No. 10, Mar. 1974.

*Primary Examiner*—Martin H. Edlow

*Attorney, Agent, or Firm*—D. I. Caplan

[57] ABSTRACT

Distortion of signals in a semiconductor charge transfer device (CTD) section of N transfer stages, caused by incomplete transfer of electrical charges between successive stages in the device, is reduced by filtering the output signal of the device with an auxiliary CTD section serving as a filter for the N-stage CTD section. Advantageously, the ultimate (last) one of the stages in the auxiliary CTD section is built with an incomplete charge transfer coefficient characteristic which is substantially equal to the sum of the mutually substantially equal incomplete transfer characteristics of all other stages, both in the N-stage CTD section and in the other stages of the auxiliary CTD section. Thereby, the difference in transferred signal charge output from the ultimate and the penultimate (next to the last) auxiliary stages (at a selected time relative to the CTD time clock) yields a corrected output signal for the N-stage CTD section.

11 Claims, 4 Drawing Figures

TRANSFER FILTER FOR TRANSFER DEVICES

CROSS REFERENCE TO RELATED APPLICATION

This application is a continuation-in-part of our copending application, Ser. No. 373,269, filed June 25, 1973 and was abandoned.

FIELD OF THE INVENTION

This invention relates to the field of shift-register devices, and more particularly to shift-register devices operating by means of electrical charge transfer through a semiconductor medium.

BACKGROUND OF THE INVENTION

In the prior art, shift-register operation has been achieved in semiconductor devices by means of the electrically controlled shifting of localized accumulations of charges in a semiconductor medium. Such charges are controllably translated through the semiconductor by means of applied clock voltages which transfer electrical charges from one storage site to the next in the semiconductor device. Thus, such a semiconductor shift-register is, in effect, a type of charge transfer device (CTD).

Charge transfer devices in the semiconductor art fall into two main categories, the so-called "charge-coupled device" (CCD) and integrated circuit versions of the bucket-brigate device (BBD). In either version, a spatially periodic electrode metallization pattern on a major surface of a semiconductor body coated with oxide defines a sequence of integrated MOS (metal-oxide-semiconductor) type capacitors, so that localized electrical charge accumulations in the semiconductor can be shifted through the semiconductor sequentially between adjacent MOS capacitors by sequential (clock) electrical voltage pulses applied to the electrodes. These charges are initially injected at the input end of a chain of such MOS capacitors, in accordance with a stream of digital or analog information, for example, in the form of injected charges versus no injected charges at the appropriate moments of the clock voltage pulse sequence. In general, there are as many MOS type capacitors (storage sites) per "storage cell-"as there are phases in just one cycle of the voltage pulse sequences driving the CTD.

In the CCD version of a CTD, the signal charges injected into the semiconductor, when not being shifted, are localized as isolated inversion layers at the oxide-semiconductor interface; and the charges are shifted through the semiconductor under the influence of the clock. In the BBD version, the injected charges (when not being shifted) are localized as excess majority charge carriers in the diffused (or implanted) regions of localized PN junctions previously fabricated at the oxide-semiconductor interface; and this excess charge (not necessarily the same charge carriers originally injected) is shifted through the semiconductor under the influence of the clock.

It should be understood of course that ordinarily in present-day semiconductor charge transfer devices, the semiconductor medium is silicon and the oxide is silicon dioxide; however, other suitable semiconductor-insulator combinations may be used in general. Thus, the term "oxide" in connection with CTD's can refer to any such suitable insulator.

In general, CTD's suffer from the problem of incomplete signal charge transfer from one MOS capacitor storage site to the next, so that, at the output end of a chain of such capacitors forming the CTD, the output signal is a distorted representation of the input signal in terms of a sequence of localized output signal charge pulses. See, for example, *IEEE Journal of Solid-State Circuits*, Vol. SC-8, No. 2, pp. 108–116 (April 1973): "Incomplete Transfer in Charge-Transfer Devices", by C.N. Berglund and K. K. Thornber (having an author in common with the inventors herein). As a result of this distortion, error rates are particularly severe in relatively long chain CTD's where the number of transfer stages N exceeds about $0.1/\alpha$, where $\alpha$ is the coefficient of incomplete transfer of each substantially identical transfer stage, and where each transfer stage includes but one storage site (plus its transfer region). This coefficient $\alpha$ is defined as the ratio of the increment of signal charge (transfer charge) remaining behind in a tranfer stage to the corresponding increment of signal charge transferred from that stage to the next successive transfer stage during a single transfer cycle of the applied clock voltage. It would be desirable, therefore, to have a means for reducing the errors caused in CTD's by incomplete transfer.

SUMMARY OF THE INVENTION

In accordance with the invention, a sequence of several auxiliary charge transfer device (CTD) type of transfer stages (forming an "auxiliary section") is added to the output end of a main CTD of N advantageously substantially identical transfer stages (forming a "main CDT section"). The output of the main CTD section is fed to the input side of the auxiliary CTD section. The coefficient $\alpha$ (defined above) of incomplete transfer characteristic of the last auxiliary transfer stage of the auxiliary CTD section is made advantageously at least approximately equal to (within about 10 percent) the sum of the coefficients of incomplete transfer characteristic of all the stages in the main CTD section plus those of the other auxiliary stages. The difference of transferred electrical charge, at a predetermined time relative to the driving clock cycle, contained in another of the auxiliary transfer stages with respect to said last auxiliary stage yields a corrected output signal for the N-stage CTD section.

In a specific embodiment of the invention, an N-stage conventional type two-phase BBD section is terminated in a four-stage auxiliary (filtering) BBD section. Both the N-stage and the auxiliary BBD sections are integrated in a single n-type conductivity monocrystalline semiconductor body. Each transfer stage in both BBD sections is defined by an MOS capacitor element (together with a p-type conductivity zone in the semiconductor at its surface) formed by an electrode on the oxide. All transfer stages in both the N-stage and the auxiliary BBD are made substantially identical, and are electrically controlled by a two-phase clock voltage pulse sequence applied to the electrodes of the respective stages, except that the last stage of the auxiliary (filtering) BBD section is associated with a semiconductor region controlled by an electrode of much larger width (in the charge transfer direction) than the (equal) widths of the other MOS capacitor electrodes in both the auxiliary filtering BBD section and the N cell BBD section. Thereby, advantageously the coefficients of incomplete transfer of all stages in both the N-stage sections and the auxiliary BBD section (except for the last stage) are made substantially equal, to within 10 percent for analog signals and to within 50 percent for digital signals. More particularly, by tailoring the electrode associated with the last auxiliary transfer stage, the incomplete charge transfer characteristics $\alpha$ (defined above) of the last stage of the auxiliary BBD section is made substantially equal to (within 10 percent) the sum of the substantially mutually equal coefficients of incomplete transfer of all the other stages, both of the N-stage BBD section and of the other stages of the filtering BBD section. Advantageously, all the individual $\alpha$'s are sufficiently small that this sum does not exceed about 0.1. Thereby, the difference in transferred charge accumulation (at a suitable detection time in the clock cycle) in the last stage of the auxiliary filtering BBD section relative to the next-to-last stage of the very same filtering BBD section is the desired corrected output signal for the N-stage BBD section.

In a broader aspect of this invention, an N-stage shift-register section, each transfer stage of which characterized by incomplete transfer, is terminated in an auxiliary shift-register section. The last stage of the auxiliary register section has a coefficient $\alpha$ of incomplete transfer of signal entity which is of the order of, and advantageously within about 10 percent of, the sum (again advantageously less than about 0.1) of all the coefficients of all the other cells in the combined device (N-stage plus auxiliary shift-registers). This coefficient $\alpha$ is defined the same way in terms of signal entity (transfer entity) as previously defined in terms of signal charge. Then, the difference in storage of transfer signal entity in one of the stages in the auxiliary register section relative to said last stage of this auxiliary register section, at a predetermined time, is a corrected output signal for the N-stage register section, that is, an output characterized by reduced errors due to incomplete transfer. The reason for this reduction in errors is attributable to the reflection and substantial duplication of incomplete transfer error in the N-stages by the last stage of the auxiliary shift-register section, and the subtraction of this error from the output signal.

This invention, together with its features, advantages, and objects, can be better understood from the following detailed description when read in conjunction with the drawing (not to scale, for clarity only) in which.

DETAILED DESCRIPTION

Figure 1:
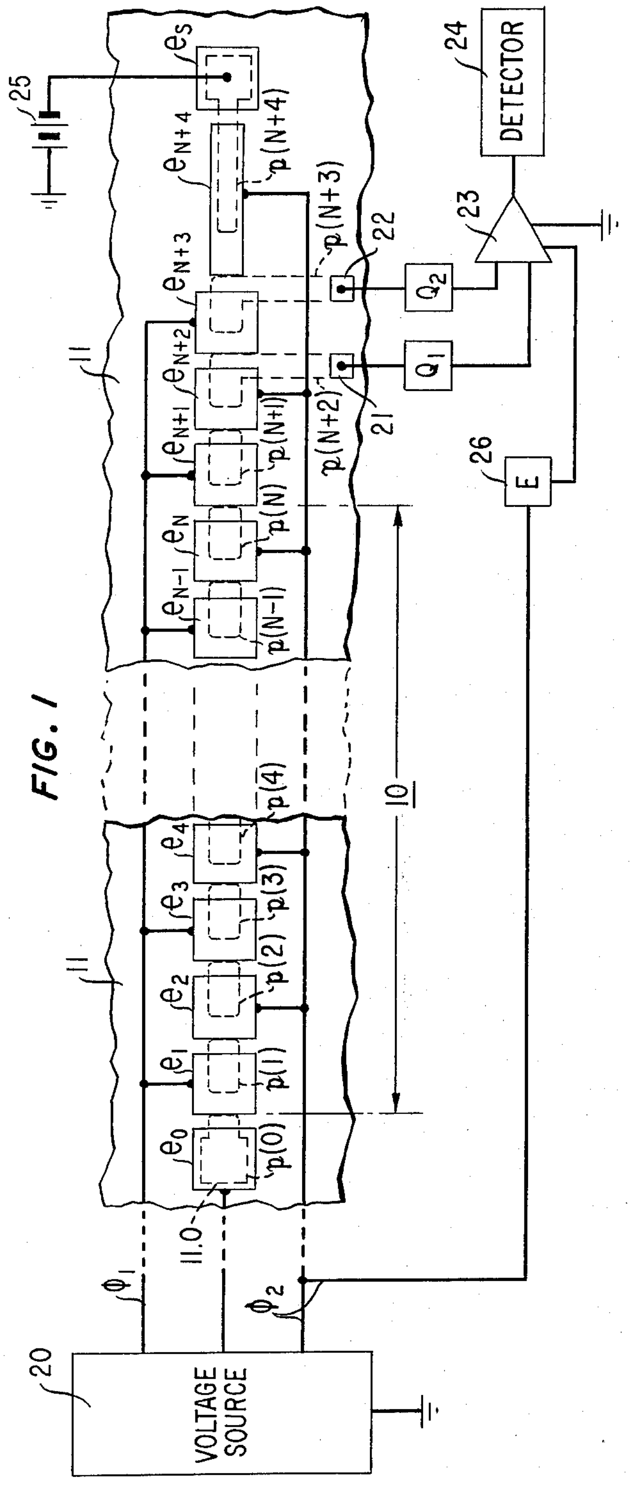
FIG. 1 is a top view diagram of a semiconductor bucket brigade transfer device with an auxiliary bucket brigade transfer device filter, in accordance with a specific embodiment of the invention.

As shown in FIG. 1, as N-stage bucket brigade device section 10 is integrated in a single *n*-type conductivity silicon semiconductor crystal 11. The device section 10 includes an array of advantageously substantially identical electrodes $e_1$, $e_2$ . . . $e_{N-1}$, $e_N$ (located on an oxide layer on a major surface of the crystal 11), each electrode being associated with a different charge transfer stage of the main BBD section formed by these N stages. Each transfer stage also includes an associated p-type conductivity zone, $p(1)$, $p(2)$, . . . $p(N-1)$, $p(N)$, all substantially identical, as known in the art of bucket brigade devices. See, for examples, "Performance Limitations of the IGFET Bucket-Brigade Shift Register" by C. N. Berglund and H. J. Boll in *IEEE Transactions on Electron Devices*, Vol. ED-19, pp. 852–860 (July 1972); and "Bucket-brigade electronics" by F. L. J. Sangster and K. Teer in *IEEE Journal of Solid State Circuits*, Vol. SC-4, pp. 131–136 (June 1969). These transfer stages are driven by a two phase ($\phi_1$, $\phi_2$) clock supplied by a voltage source 20. Input signals to this N-stage BBD section are also supplied by the source 20 to an electrode $e_o$ penetrating the oxide layer to make contact with an associated $p+$-type conductivity zone $p(o)$ in the semiconductor 11 (at the left-hand edge of electrode $e_1$). These input signals cause injection of localized electronic holes (deficiencies of electrons) into the semiconductor, which are shifted sequentially from left to right in FIG. 1 through the N-stages, in response to the applied two-phase clock voltages ($\phi_1$, $\phi_2$) in accordance with known charge transfer device principles.

In accordance with a feature of the invention, additional auxiliary charge transfer stages are located on the right-hand side of the N-stage device section 10 for the purpose of supplying an auxiliary BBD section. This auxiliary BBD enables the reduction of errors in the output of the N-stage BBD section caused by incomplete charge transfer. This auxiliary filtering BBD section includes electrodes $e_{N+1}$, $e_{N+2}$, $e_{N+3}$, $e_{N+4}$ on the surface of the oxide on the same crystal 11, with associated *p*-type zones $p(N+1)$, $p(N+2)$, $p(N+3)$, $p(N+4)$. Electrodes $e_{N+1}$, $e_{N+2}$ and $e_{N+3}$ are advantageously substantially identical to electrodes $e_1$ $e_2$, . . . ; whereas electrode $e_{N+4}$ is no longer in the charge transfer direction (left to right) as more fully discussed below, in order to increase the value of the coefficient of incomplete transfer of signal charge from the stage associated with electrode $e_{N+3}$. The *p*-type conductivity zone $p(N+1)$ under electrode $e_{N+1}$ is typically made substantially identical to $p(1)$, $p(2)$, . . . . On the other hand, the *p*-type conductivity zones $p(N+2)$ and $p(N+3)$ are elongated transversely with respect to the charge transfer direction for termination in electrode terminal contacts 21 and 22 penetrating the oxide on the silicon crystal 11 thereat. Also, a $p+$-type conductivity zone $P(N+4)$ underneath electrode $e_{N+4}$ runs along the surface of the silicon crystal 11 to a sink electrode $e_S$ penetrating the oxide to connect electrically with this zone $p(N+4)$. It should be noted that zones $P(o)$ and $p(N+4)$ typically have higher (more strongly) *p*-type conductivity than the other *p*-type zone $p(1)$, $p(2)$, . . . $p(N+2)$, $p(N+3)$. A battery 25 supplies sufficient negative voltage to electrode $e_S$ for collecting (annihilating) the electronic holes being transferred from underneath electrode $e_{N+3}$ to underneath $e_{N+4}$ during operation.

Electrode contacts 21 and 22 are connected to electrical signal charge sensors $Q_1$ and $Q_2$, respectively, responsive to the transfer signal charge Q, in zones $p(N+2)$ and $p(N+3)$, respectively. These sensors feed a difference amplifier 23 whose instantaneous output is fed only during finite intervals of time *dt* selected by an adjustable strobe Enabler 26(E) to a utilization detector 24 responsive thereto, as more fully described below. These difference charges ($Q_1$–$Q_2$) during the selected intervals *dt* of time represent a corrected output signal for the device 10.

Since all the transfer stages in the semiconductor 11 associated with electrodes $e_1$, $e_2$ . . . $e_{N+1}$, $e_{N+2}$, $e_{N+3}$ are typically substantially identical (except for applied clock phase cycle $\phi_1$ vs. $\phi_2$), the coefficient of incomplete charge transfer associated with these stages will also be typically substantially identical. On the other hand, in accordance with the invention, electrode $e_{N+4}$ with its associated *p*-type zone *p*(N+4) is relatively elongated in the charge transfer direction (as well as optionally or alternatively relatively narrowed transversely to the charge transfer direction), in order to make its associated coefficient $\alpha$ (defined above) of incomplete transfer of the order of, advantageously at least approximately equal to, the sum of the coefficients of incomplete transfer of the transfer stages associated with electrodes $e_1$, $e_2$, $e_3$ . . . $e_N$, $e_{N+1}$, $e_{N+2}$, and $e_{N+3}$. For example, since incomplete charge transfer is approximately directly proportioned to the square of length of electrode in the charge transfer direction, assuming equal coefficients $\alpha$ for the previous (N+3) stages, the length of electrode $e_{N+4}$ is advantageously made longer by a factor of $(N+3)^{1/2}$, while its width in the direction transverse to the charge transfer is made the same as that of the other electrodes.

Figure 2:
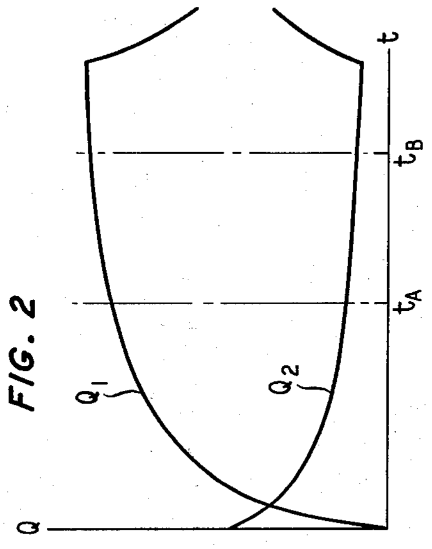
FIG. 2 shows a plot of charge response vs. time, useful in explaining the operation of the embodiment shown in FIG. 1.

FIG. 2 illustrates a graphical plot of electrical signal charge responses $Q_1$ and $Q_2$ of the corresponding signal charge detectors $Q_1$ and $Q_2$ of FIG. 1, as a function of time commencing at the beginning of a clock cycle. Generally for any signal charges in the process of being detected, the profile (FIG. 2) of $Q_1$ steadily increases to a maximum value at the end of the first half of the cycle, at which time $Q_1$ abruptly starts to decrease; whereas $Q_2$ steadily decreases to a minimum value at the end of the first half of the cycle, at which time $Q_2$ abruptly starts to increase. The instantaneous outputs of the corresponding detectors $Q_1$ and $Q_2$ in FIG. 1, which are sensitive to these corresponding instantaneous values of charge $Q_1$ and $Q_2$, are fed to a difference amplifier 23 which instantaneously, detects these charges, without sample or hold, only during the selected finite time intervals *dt* (to be described in detail below) to produce an output proportional to the difference $Q_1$–$Q_2$ during every *dt*. This difference output is fed to utilization means 24. More specifically, the difference amplifier 23 is controlled by a strobe Enabler 26, so that the amplifier 23 can respond to $Q_1$ and $Q_2$, to produce the output proportional to $Q_1$–$Q_2$, only during mutually equal selected periodic time intervals *dt* as determined by the strobe Enabler 26. The strobe Enabler is keyed to a clock phase $\phi_2$ (or $\phi_1$ alternatively), so that the periodicity of the selected time intervals *dt* is the same as a full clock cycle. Thus, each such time interval *dt* during every clock period commences after the same lapse of time after the beginning of each clock cycle; while the amplifier 23 is enabled (switched ON) by the strobe Enabler periodically during the selected time intervals *dt* and is disabled (switched OFF) otherwise.

The determination of useful operating values of *dt* is conveniently carried out as follows. A sequence of mutually equal input signal test charge packets is passed through the device 10. These signal charges can be of any convenient size, although experience may teach an optimum size for these test charge packets. Each of these test packets will produce responses $Q_1$ and $Q_2$ as shown in FIG. 2. A time $t_A$ is defined as that time at which $Q_1$ reaches a value which is at least nearly equal to its maximum value (advantageously within about 10 percent). A time $t_B$ subsequent to $t_A$ is defined conveniently, but otherwise arbitrarily, as some point in time prior to the termination of the first half cycle (thereby ensuring the exclusion from the interval $t_A$ $t_B$ of the precipitous changes in Q at the end of each of the first half cycles). Thus, during the entire time slot $t_A$ to $t_B$ the charge $Q_1$ is very nearly equal to its maximum. Then, the selected interval *dt* is defined as any interval within $t_A$ to $t_B$ which is convenient for switching ON the difference amplifier 23, as determined by the capability of the strobe Enabler 24 and the amplifier circuitry (time-constant limitations, for example). The intervals *dt* are otherwise arbitrary, but are all located similarly within $t_A$ $t_B$ in any event. Accordingly, the strobe Enabler is adjusted to enable (switch ON) the amplifier 23 periodically (during every *dt*) and to disable (switch OFF) the amplifier otherwise. Once the strobe Enabler 24 has thus been adjusted, its adjustment is kept fixed for use of the device 10 with other (than test) signal charge packets, that is, independent of the size of these other charge packets being transferred through the device 10.

Each output signal of $Q_1$–$Q_2$ during the time interval *dt* is a corrected representation of the size of the charge packet signal transferred through the device 10 and arriving at *p*(N+2) during the clock cycle in which the corresponding time interval *dt* is situated. Specifically, $Q_1$ during *dt* is the uncorrected output signal, whereas $Q_2$ during *dt* is the error signal to be subtracted from $Q_1$ during *dt*, according to the invention, for the each and every *dt* during the sequence of periodic clock cycles. It should be remarked that the maximum charge response of $Q_2$ is significantly less than that of $Q_1$ due to the relatively large coefficient of incomplete charge transfer from underneath electrode $e_{N+3}$ to $e_{N+4}$ as compared with $e_{N+2}$ to $e_{N+3}$.

While the device section 10 is depicted as an N-stage BBD section, it should be obvious that any other type of semiconductor charge transfer device section can be substituted therefor, such as a CCD section. For example, also suitable for the device section 10 is the stepped-oxide type of CCD, as disclosed for example in a paper published in *Applied Physics Letters*, Vol. 20, pp. 413–414 (1972) by C. N. Berglund et al, entitled "Two-Phase Stepped-Oxide CCD Shift Register Using Undercut Isolation". In addition, CCD's can also be used as the auxiliary filter devide section (associated with electrodes $e_{N+1}$, $e_{N+2}$, $e_{N+3}$, $e_{N+4}$). However, since CCD's generally lack any *p*-type zones, advantageously in any event the corresponding electrodes $e_{N+2}$, $e_{N+3}$ and $e_{N+4}$ should be spaced apart sufficiently to enable the introduction of *p*-type zones as charge detection means for connection to charge sensors $Q_1$ and $Q_2$ through electrode contacts 21 and 22, respectively.

It is advantageous that all the coefficients of incomplete transfer in the device section 10 and in all but the last transfer ($e_{N+3}$ to $e_{N+4}$) of the auxiliary filter be mutually equal to within about 10 percent for analog signal transfer and about 50 percent for digital signal transfer, and that the coefficient in this last transfer be equal to the sum of all these other coefficients to within about 10 percent, in order to have a useful correction in the output $Q_1$–$Q_2$.

Figure 3:
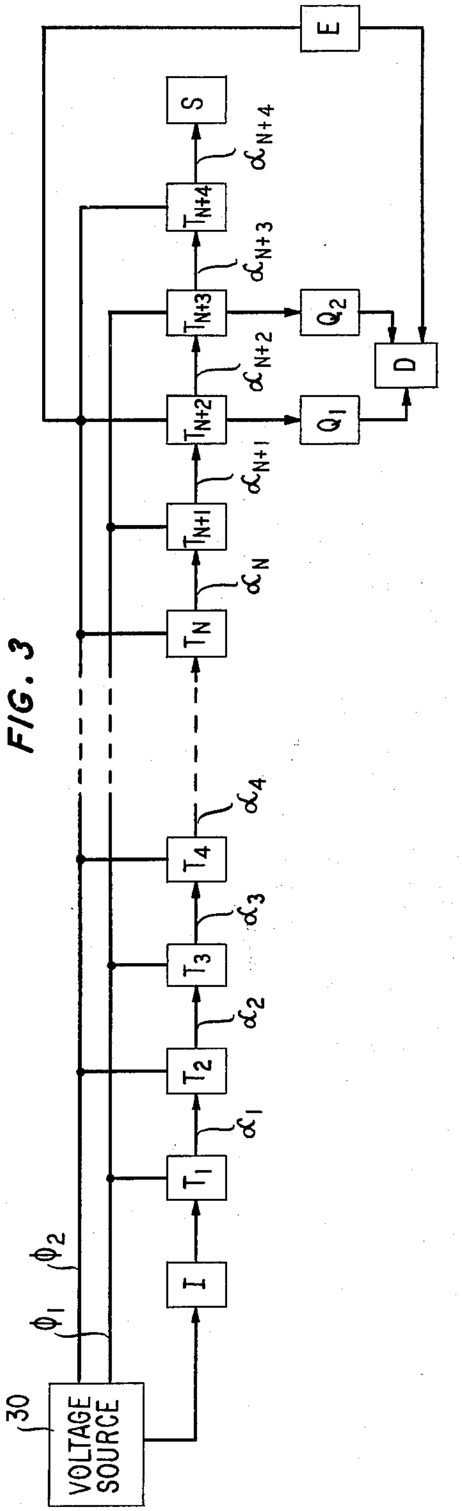
FIG. 3 shows a two-phase transfer device with a transfer filter, in accordance with an embodiment of the invention.

FIG. 3 shows an N-stage two-phase transfer device section together with an auxiliarly (filtering) transfer device section. The N-stage transfer device section is formed by N transfer sites $T_1$, $T_2$, $T_3$, . . . $T_N$ together with N transfers, each transfer characterized respectively by a coefficient of incomplete transfer $\alpha_1$, $\alpha_2$, $\alpha_3$, . . . $\alpha_N$ of the transfer entity (signal entity) being transferred from site to site under the influence of a two-phase clock 30. This coefficient $\alpha$ is defined the same way in terms of transfer signal entity Q as $\alpha$was defined previously in terms of electrical signal charge in CTD's. The auxiliary transfer device is formed by transfer sites $T_{N+1}$, $T_{N+2}$, $T_{N+3}$, and $T_{N+4}$ with coefficients of incomplete transfer $\alpha_{N+1}$, $\alpha_{N+2}$, $\alpha_{N+3}$, $\alpha_{N+4}$.

An input signal to $T_1$ (FIG. 3) is fed by an input source, I, which supplies a sequence of signals in the form of the transfer entity Q to this first transfer site $T_1$, for subsequent transfer to $T_2$, $T_3$, etc., under the influence of the clock 30. A pair of detectors $Q_1$ and $Q_2$, responsive respectively to the instantaneous value of the transfer signal entity Q within the sites $T_{N+2}$ and $T_{N+3}$, feed these simultaneous responses to a difference detector D for sensing and utilizing the desired output difference signal $Q_1$–$Q_2$. The detector D senses these charge differences, however, only during periodic suitable time intervals relative to the clock phase $\phi_2$ (for alternatively $\phi_1$) as determined by the strobe network E, which is preadjusted similarly as the Enabler 26 in FIG. 1 (by trial and error) to enable the detector D to be responsive to $Q_1$ and $Q_2$ only during the selected time intervals. In accordance with the invention, $\alpha_{N+3}$ is made equal to the sum of all $\alpha$'s of the previous transfer stages, that is, $$\alpha_{N+3} = \alpha_1 + \alpha_2 + \alpha_3 + \ldots + \alpha_N + \alpha_{N+1} + \alpha_{N+2}$$

In addition, the coefficient of incomplete transfer $\alpha_{N+4}$ of entity Q from the last site $T_{N+4}$ to a sink S (for annihilating any transferred entity) is made less than $\alpha_{N+3}$, to prevent undesirable accumulation of transfer entity in transfer site $T_{N+4}$.

It should be remarked that each of the transfer sites $T_1$, $T_2$, . . . (FIG. 3) corresponds to a storage region in the semiconductor 11 (FIG. 1) underneath the respective electrodes $e_1$, $e_2$, . . . . In addition, it should be noted that the signal $Q_1$ is the uncorrected output and that the signal $Q_2$ is the correction for the signal $Q_1$, so that $Q_1$–$Q_2$ is the corrected output signal as desired. The reason for the extra transfer site $T_{N+1}$ between $T_N$ and $T_{N+2}$ is to provide the (uncorrected) signal $Q_1$, and hence (corrected) signal $Q_1$–$Q_2$, in phase with the second clock phase $\phi_2$; and thus this site $T_{N+1}$ can be omitted if signal $Q_1$ and hence $Q_1$–$Q_2$ is desired in phase with the first clock phase $\phi_1$ rather than the second clock phase $\phi_2$.

Figure 4:
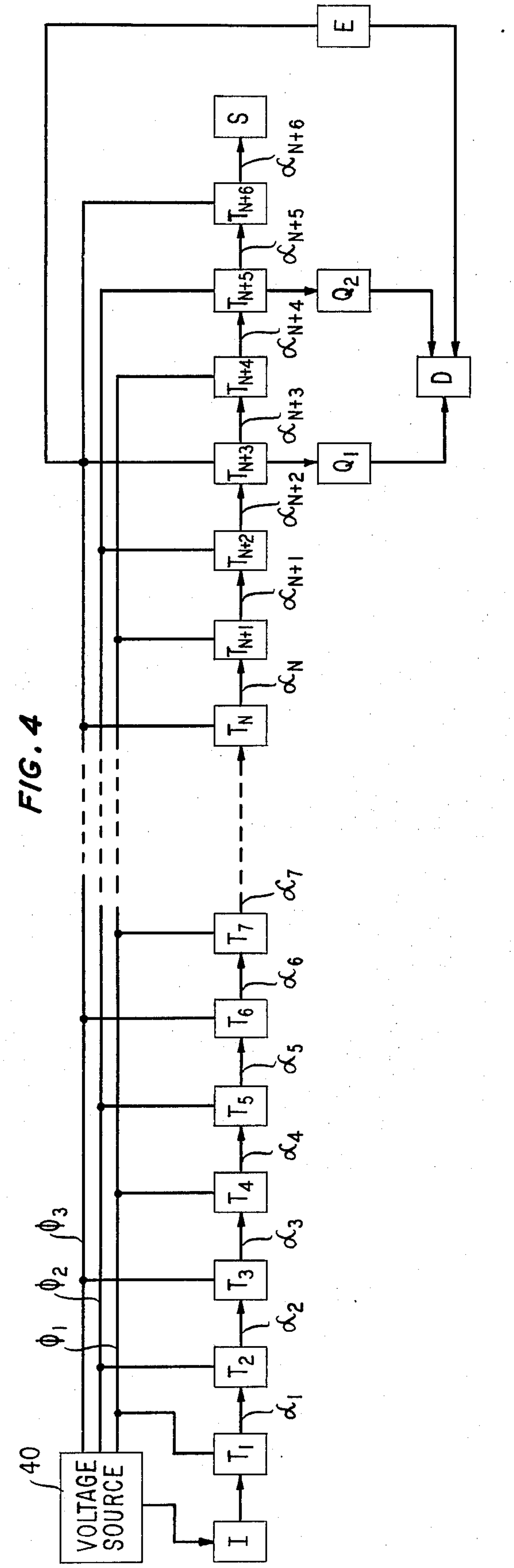
FIG. 4 shows a three-phase transfer device with a transfer filter, in accordance with another embodiment of the invention.

FIG. 4 shows a three-phase transfer device section with an auxiliary transfer filtering device section, according to another embodiment of the invention. These are many points of similarity of the arrangement shown in FIG. 4 with that previously discussed in connection with FIG. 3; and accordingly similar elements are labelled with similar reference indicators. Each transfer stage is again characterized by a storage site T and an incomplete transfer coefficient $\alpha$. It is to be noted in connection with FIG. 4 that, in accordance with the invention; $\alpha_{N+5}$ is at least of the order of, and advantageously approximately equal to: $\alpha_1 + \alpha_2 + \ldots \alpha_{N+4}$, and that $\alpha_{N+6}$ is advantageously less than $\alpha_{N+5}$.

It should be obvious that the detector $Q_1$ (FIG. 4) can be connected to be responsive to the transfer entity Q in $T_{N+1}$ or $T_{N+2}$ instead of in $T_{N+3}$, with a consequent phase change in the output; and that $Q_2$ should be connected just one transfer stage removed to the output end (right-hand direction) of the chain of storage sites from that site to which detector $Q_1$ is connected. In any event, $Q_2$ is the signal output of that transfer stage with coefficient $\alpha$ equal to the sum of the others, in accordance with the invention.

It should be obvious, in view of the above discussion, that this invention is thus applicable in particular to three-phase (or more phases) semiconductor charge transfer devices, simply by realizing each of the storage sites $T_1$, $T_2$, . . . (FIG. 4) as associated with a semiconductor region underneath an electrode $e_1$, $e_2$ . . . (FIG. 1) on an oxide layer on the surface of a semiconductor crystal, that is to say, each transfer site T (FIG. 3 or 4) is a generalization of each MOS capacitor element (FIG. 1).

While this invention has been described in detail in terms of specific embodiments, various modifications can be made without departing from the scope of the invention.

What is claimed is:

1. A transfer device which comprises:

a. a first transfer device section having N successive transfer stages for transferring a transfer signal entity in a transfer direction from stage to stage sequentially;

b. a second transfer device section, responsive to the output of the first transfer device section, having at least two transfer stages of which one stage has a coefficient of incomplete transfer which is within 50 percent of the sum of the coefficients of incomplete transfer in all transfer stages in the first and second sections previous in the transfer direction to the said one stage.

2. A transfer device according to claim 1 in which the said coefficient of incomplete transfer is within about 10 percent equal to said sum.

3. A transfer device according to claim 1 which further includes means responsive to said one stage for detecting the difference in quantity of transfer entity in said one stage relative to another stage during periodically recurring predetermined time intervals.

4. A transfer device according to claim 3 in which said another stage is located in the second transfer device section.

5. A transfer device according to claim 3 which further includes means connected to the first transfer stage of the first transfer device section for feeding an input to said first transfer stage for subsequent transfer through the first and second transfer devide sections.

6. A transfer device according to claim 1 which further includes means connected to the first transfer stage of the first transfer device section for feeding an input to said first transfer stage for subsequent transfer through the first and second transfer device sections.

7. A transfer device according to claim 1 in which the first and second transfer device sections are both semiconductor charge transfer device sections integrated in a single semiconductor crystal.

8. A transfer device according to claim 7 which further includes clock pulse driving means sequentially connected to the transfer stages in at least the first transfer device section for transferring localized accumulations of electrical charge from one stage to the next sequentially through the first and second transfer device sections.

9. A transfer device according to claim 2 in which the first and second transfer are both semiconductor charge transfer devices integrated in a single semiconductor crystal.

10. A transfer device according to claim 9 in which all the coefficients of incomplete transfer of all the transfer stages in first device section and of the said another stage in the second device section are within about 10 percent equal to each other.

11. A transfer device according to claim 9 in which the second transfer device section is a bucket brigade device section.

* * * * *